(12) United States Patent
Østerberg et al.

(10) Patent No.: US 11,693,028 B2
(45) Date of Patent: Jul. 4, 2023

(54) PROBE FOR TESTING AN ELECTRICAL PROPERTY OF A TEST SAMPLE

(71) Applicant: KLA CORPORATION, Milpitas, CA (US)

(72) Inventors: Frederik Westergaard Østerberg, Hellerup (DK); Dirch Hjorth Petersen, Herlev (DK); Henrik Hartmann Henrichsen, Copenhagen (DK); Alberto Cagliani, Copenhagen (DK); Ole Hansen, Hørsholm (DK); Peter Folmer Nielsen, Harlev (DK)

(73) Assignee: KLA CORPORATION, Milpitas, CA (US)

( * ) Notice: Subject to any disclaimer, the term of this patent is extended or adjusted under 35 U.S.C. 154(b) by 387 days.

(21) Appl. No.: 16/764,038

(22) PCT Filed: Nov. 15, 2018

(86) PCT No.: PCT/EP2018/080782
§ 371 (c)(1),
(2) Date: May 14, 2020

(87) PCT Pub. No.: WO2019/096695
PCT Pub. Date: May 23, 2019

(65) Prior Publication Data
US 2020/0278380 A1  Sep. 3, 2020

(30) Foreign Application Priority Data

Nov. 15, 2017  (DK) .............................. PA 2017 00651

(51) Int. Cl.
*G01R 1/067*  (2006.01)
*G01K 7/16*  (2006.01)
*B82Y 30/00*  (2011.01)

(52) U.S. Cl.
CPC .......... *G01R 1/06794* (2013.01); *G01K 7/16* (2013.01); *G01R 1/06727* (2013.01)

(58) Field of Classification Search
CPC .......... B82Y 30/00; B82Y 35/00; G01K 7/16; G01K 7/18
See application file for complete search history.

(56) References Cited

U.S. PATENT DOCUMENTS 4,201,939 A  5/1980  Lee et al.
5,441,343 A  8/1995  Pylkki et al.
(Continued)

FOREIGN PATENT DOCUMENTS

CN  1116707 A  2/1996
CN  1955743 A  5/2007
(Continued)

OTHER PUBLICATIONS

WIPO, ISR for PCT/EP2018/080782, dated May 20, 2019.
(Continued)

*Primary Examiner* — Jermele M Hollington
*Assistant Examiner* — Temilade S Rhodes-Vivour
(74) *Attorney, Agent, or Firm* — Hodgson Russ LLP

(57) ABSTRACT

A probe for direct nano- and micro-scale electrical characterization of materials and semi conductor wafers. The probe comprises a probe body, a first cantilever extending from the probe body, and a first thermal detector extending from the probe body. The thermal detector is used to position the cantilever with respect to a test sample.

15 Claims, 11 Drawing Sheets

(56) References Cited

U.S. PATENT DOCUMENTS

| | | | |
|---|---|---|---|
| 6,552,556 | B1 | 4/2003 | Miki |
| 7,186,019 | B2 | 3/2007 | Binnig et al. |
| 7,448,798 | B1 | 11/2008 | Wang |
| 8,689,359 | B2 * | 4/2014 | Rangelow ............ G01Q 10/045 850/57 |
| 8,719,960 | B2 * | 5/2014 | King ...................... G01K 1/143 850/13 |
| 2001/0050565 | A1 | 12/2001 | Petersen et al. |
| 2003/0214309 | A1 | 11/2003 | Shim et al. |
| 2006/0254345 | A1 | 11/2006 | King et al. |
| 2007/0091512 | A1 | 4/2007 | Nichols et al. |
| 2009/0139340 | A1 * | 6/2009 | King ....................... G01B 7/18 73/766 |
| 2009/0261849 | A1 | 10/2009 | McGlory et al. |
| 2010/0116038 | A1 | 5/2010 | Baechtold et al. |
| 2010/0164526 | A1 * | 7/2010 | Pagani ............... G01R 1/06733 324/756.03 |
| 2010/0232067 | A1 | 9/2010 | Liners et al. |
| 2010/0290501 | A1 * | 11/2010 | De Bruyker ......... G01K 17/006 374/31 |
| 2011/0038392 | A1 | 2/2011 | Ando et al. |
| 2011/0164655 | A1 | 7/2011 | Nawai et al. |
| 2011/0268148 | A1 * | 11/2011 | King ................. G01N 25/4813 374/E17.003 |
| 2012/0223804 | A1 * | 9/2012 | Gaitas ..................... H01C 7/06 338/307 |
| 2013/0047303 | A1 | 2/2013 | King et al. |
| 2013/0202012 | A1 * | 8/2013 | Peroulis .................. G01K 7/34 216/13 |
| 2014/0047585 | A1 * | 2/2014 | Hofrichter ............. G01Q 60/38 850/56 |
| 2014/0218119 | A1 | 8/2014 | He |
| 2014/0269819 | A1 | 9/2014 | Kiely et al. |

FOREIGN PATENT DOCUMENTS

| | | |
|---|---|---|
| CN | 201145934 Y | 11/2008 |
| CN | 101657729 A | 2/2010 |
| CN | 101813713 A | 8/2010 |
| CN | 106574942 A | 4/2017 |
| CN | 107037346 A | 8/2017 |
| EP | 1045253 A2 | 10/2000 |
| EP | 1330823 B1 | 11/2007 |
| EP | 2293086 A1 | 3/2011 |
| EP | 0834069 B1 | 3/2013 |
| EP | 2690625 A3 | 1/2014 |
| JP | H06097243 A | 4/1994 |
| JP | 2000284025 A | 10/2000 |
| JP | 2007311389 A | 11/2007 |
| JP | 2017166845 A | 9/2017 |
| TW | 201116833 A | 5/2011 |
| TW | 201241439 A | 10/2012 |
| WO | 0237488 A1 | 5/2002 |

OTHER PUBLICATIONS

JPO, Office Action for JP Application No. 2020-526477, dated Sep. 8, 2022.

CNIPA, Office Action for CN Application No. 201880071948.2, dated Aug. 29, 2022.

CNIPA, Office Action for CN Application No. 201880071948.2, dated Mar. 31, 2023.

* cited by examiner

PROBE FOR TESTING AN ELECTRICAL PROPERTY OF A TEST SAMPLE

The present invention relates to a method of contacting a probe with a test sample for testing an electrical property of the test sample, specifically the present invention is directed to a micro cantilever multi point probe with a thermal detector. The present invention furthermore relates to a system for testing an electrical property of a test sample, a method for rescaling a measurement of a thermal detector to compensate for geometrical variations, and a method of determining a proximity between a thermal detector and a test sample.

A test sample may also consist of a semiconductor wafer with on top a thin planar continuous conducting film or a thin multilayer stack forming, for example a magnetic tunnelling junction (MTJ).

The test sample may also be a semiconductor wafer of silicon having an integrated CMOS circuit implemented for example with a number of CMOS transistors. In this case, the sample may contain specific test pads where a portion of the conductive films or stack undertest is dedicated for electrical characterization. The test pads may also be composed by a dense array of finFET transistors.

A multipoint probe measurement and test routine such as a four point probe measurement is also known as four terminal sensing, wherein an electrical impedance measuring technique uses separate pairs of current-carrying and voltage-sensing electrodes (contact probes with tips for contacting the test sample).

When performing resistance measurements for determining electrical properties of a test sample, a test probe comprising one or more electrodes for establishing electrical contact to the test surface is brought into contact with the test surface.

An example of a micro four point probe is disclosed in EP2293086, which disclosure is incorporated in the present application by reference. The probe disclosed in EP2293086 comprises four cantilevers extending from a probe body.

The probe is part of a test apparatus or system, which comprises an actuator for moving the probe into contact with the test sample, which is placed in the test apparatus.

The dimensions are in the micro- or nanometer scale, and it is important to have a controlled and precise landing of the tip (tip end of the contact probe) on the test sample such that when the actuator stops, the tip is within at least 200 nm of the surface of the test sample and preferably within ±50 nm of the surface of the test sample.

A controlled landing may prevent the electrodes to break, and the test sample being contaminated with probe debris, and that a good stable ohmic contact may be established.

The landing of the probe may be controlled using a strain gauge detector (mechanical contact detection) or using an electrical contact detection by measuring the electrical impedance between multiple contact probes for example, i.e. when the impedance between multiple contact probes decreases it may be assumed that the contact probes are in contact with the test sample and a current flows in the test sample between at least two contact probes.

Each of these methods of landing or contacting the test sample have disadvantages such as a relative large total footprint, as in the case of strain gauge based surface detection, which requires an extra cantilever to touch the sample surface, with respect to the electrical detection. A larger footprint implies higher contamination of the sample from the contact with the probe. On the other hand, for non-conducting surfaces (or oxidized surfaces) of the test sample, the electrical detection does not work, limiting its applicability.

An example of using heat to measure a distance across an air gap is disclosed in U.S. Pat. No. 7,186,019, which is incorporated in the present disclosure by reference. However, the device in U.S. Pat. No. 7,186,019 has no contact probes for measuring an electrical property of the test sample, and the device is also not brought in contact with the test sample.

It is an object of the present invention to reduce at least some of the above mentioned disadvantages.

The above object and advantages together with numerous other objects and advantages, which will be evident from the description of the present invention, are according to a first aspect of the present invention obtained by:

A method of approaching a probe to a test sample for testing an electrical property of said test sample, said method comprising:

providing a probe having a probe body defining a planar surface for supporting a first cantilever, and a first thermal detector, said first cantilever extending from said probe body in a
        co-planar relationship with respect to said planar surface between a first proximal end supported by said planar surface and a first distal end opposite to said first proximal end, said first cantilever having a cantilever surface supporting a first contact probe, said first thermal detector extending from said probe body
        in a co-planar relationship with respect to said planar surface between a second proximal end supported by said planar surface, and a second distal end opposite said second proximal end, said first thermal detector having a detector surface supporting an electrical conductor with a temperature dependent electrical resistance, said method further comprising:

establishing a temperature difference between said electrical conductor and said test sample, injecting an electric current in said electrical conductor, providing an electronic circuit, connecting said electronic circuit to said electrical conductor, measuring said temperature dependent electrical resistance by means of said electronic circuit while moving said probe towards said test sample, and stopping said probe when said temperature dependent electrical resistance reaches a first threshold value representing the occurrence of said contact probe being in proximity or contacting said test sample.

Proximate is to be understood as being near or so near that the contact probe abuts the test sample.

The threshold value may be selected from empirical measurements such that the probe is stopped when it has a distance between 0-10 µm to the surface of the test sample.

The probe may then be moved a fixed distance towards the test sample in order to bring the probe into physical contact with the test sample. This fixed distance may be selected from any of the ranges 0.5-8 µm, or 0.5-6 µm, or 0.5-4 µm, or 0.5-2 µm, or 1-7 µm, or 1-3 µm—depending on how far from the test sample the probe is stopped.

Alternatively, the threshold value may be selected so that the probe contacts the test sample when the threshold value is reached. In such a case it is not necessary to move the probe the final distance in order to contact the test sample.

Normally, the occurrence of a contact means that the probe has landed on the test sample with the tip of the contact probe contacting the surface of the test sample.

However, in general, contacting is to be understood in the sense that the contact probe is not necessarily in physical contact with test sample, but that it is so close to the test sample that there exist a capacitive connection between the contact probe and the test sample such that an alternating current in the contact probe may run over into the test sample, i.e. the capacitive contact being greater than 0 and less than 1 mF.

The probe may have a second cantilever extending from said probe body in a co-planar relationship with respect to the planar surface. The probe may also have a second thermal detector extending from said probe body in a co-planar relationship with respect to the planar surface.

The temperature dependent electrical resistance may implicitly be measured by measuring the voltage drop across the temperature dependent electrical resistance.

The first thermal detector may define a loop with respect to the probe body, i.e. the first thermal detector extends away from the probe body at a first point and returns to the probe body at a second point (the thermal detector begins and ends on the probe body).

The temperature difference may be established by providing a heater, which heats the electrical conductor relative to the test sample, i.e. the temperature of the electrical conductor is increased more than the temperature of the test sample. The reverse may also be the case, i.e. a heater is provided, which heats the test sample relative to the electrical conductor.

Alternatively, a cooler may be provided which cools the electrical conductor relative to the test sample—or the cooler may cool the test sample relative to the electrical conductor.

The current injected in the electrical conductor may be used to heat the electrical conductor, i.e. the current may have an amplitude such that the electrical conductor is heated to a temperature above room temperature. The current may be an alternating current.

The current may be injected in the electrical conductor by means of a current source, which may provide for a constant current being conducted in the electrical conductor.

The first threshold value may be selected such that the distance between the contact probe and the test sample is below a second threshold value.

The first threshold value may be selected such that the it is a function of a statistical distribution defining a variance between measurements with a plurality of probes—each probe being made according to the present invention.

According to a second aspect of the present invention, the above objects and advantages are obtained by:

A system for testing an electrical property of a test sample, said system comprising: a probe having a probe body defining a planar surface for supporting a first cantilever, and a first thermal detector, said first cantilever extending from said probe body in a co-planar relationship with respect to said planar surface between a first proximal end supported by said planar surface and a first distal end opposite to said first proximal end, said first cantilever having a cantilever surface supporting a first contact probe, said first thermal detector extending from said probe body in a co-planar relationship with respect to said planar surface between a second proximal end supported by said planar surface, and a second distal end opposite said second proximal end, said first thermal detector having a detector surface supporting an electrical conductor with a temperature dependent electrical resistance, said system further comprising:

a heater or a cooler for establishing a temperature difference between said electrical conductor and said test sample, a power source interconnected with said electrical conductor for injecting a current in said temperature dependent electrical conductor, an actuator for moving said probe towards said test sample, and an electronic circuit interconnected with said electrical conductor for measuring said temperature dependent electrical resistance, and for comparing said temperature dependent electrical resistance with a threshold value.

According to a third aspect of the present invention, the above objects and advantages are obtained by:

A method of normalizing a measurement of a thermal detector measuring a proximity between said thermal detector and a test sample, said method comprising:

providing a probe having a probe body defining a planar surface for supporting a thermal detector, said thermal detector extending from said probe body in a co-planar relationship with respect to said planar surface between a proximal end supported by said planar surface, and a distal end opposite said proximal end, said thermal detector defining a detector geometry with a first geometric dimension, and having a detector surface supporting an electrical conductor with a temperature dependent electrical resistance, said method further comprising:

injecting a current in said electrical conductor, providing an electronic circuit, connecting said electronic circuit to said electrical conductor and measuring said electrical resistance by means of said electrical circuit for providing an output, performing a mathematical normalization of said output by said first geometric dimension such that said output being normalized with respect to said detector geometry.

The first geometric dimension may be represented by a measure of the temperature dependent electrical resistance at room temperature, i.e. by measuring the voltage drop across the electrical conductor and the current conducted in the electrical conductor—when the current is held constant, the voltage drop is directly proportional to the electrical resistance.

The measured electrical resistance may be normalized using a second geometric dimension of the thermal detector.

The second geometric dimension may be represented by a measure of the difference between the temperature dependent electrical resistance at room temperature and the temperature dependent electrical resistance at a temperature above room temperature.

The measured electrical resistance may be normalized using a third geometric dimension of the thermal detector constituted by the thickness of the electrical conductor.

According to a fourth aspect of the present invention, the above objects and advantages are obtained by:

A method of determining a proximity between a thermal detector and a test sample, said method comprising:

providing a probe having a probe body defining a planar surface for supporting a thermal detector, said thermal detector extending from said probe body in a co-planar relationship with respect to said planar surface between a proximal end supported by said planar surface, and a distal end opposite said proximal end, said thermal detector defining a detector geometry with a first geometric dimension, and having a detector surface supporting an electrical conductor with a temperature dependent electrical resistance, said method further comprising:

establishing a temperature difference between said electrical conductor and said test sample, injecting an alternating current with a first frequency in said electrical conductor, providing an electronic circuit, connecting said electronic circuit to said electrical conductor, measuring said electrical resistance by means of said electronic circuit and providing an output while moving said probe towards said test sample, providing a filter with a cut off frequency lower than a second harmonic of said first frequency, filtering said output by means of said high pass filter, and providing a filtered signal, using said filtered signal as a measure for the proximity between said thermal detector and said test sample.

The invention will now be explained in more detail below by means of examples of embodiments with reference to the very schematic drawing, in which FIG. 1 shows a perspective of a probe for testing an electrical property of a test sample.

Figure 1:
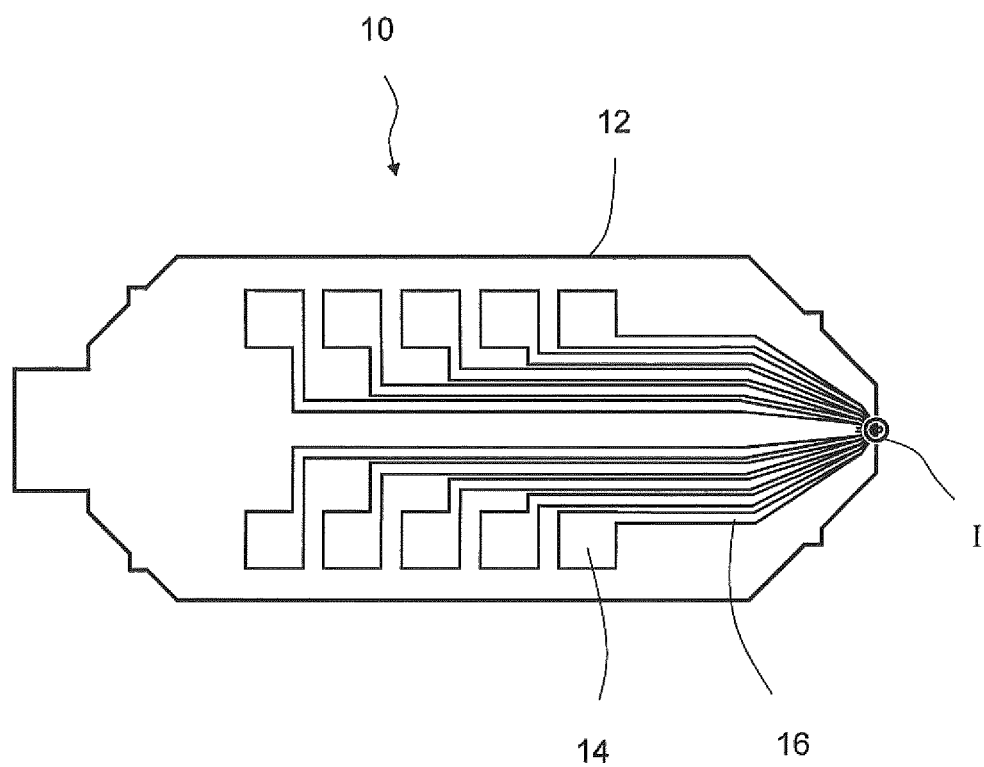

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. Like elements will, thus, not be described in detail with respect to the description of each figure.

FIG. 1 shows a perspective of a probe for testing an electrical property of a test sample.

The probe 10 comprises a probe body 12, which may be made of a number of semiconductor, metallic and/or dielectric layers. The probe body has a first side defining a substantial planar body surface, i.e. the surface is as planar as allowed by the manufacturing process. The probe body has a second side opposite the first side and a front side defining a front surface 32 between the first side and the second side.

Figure 2:
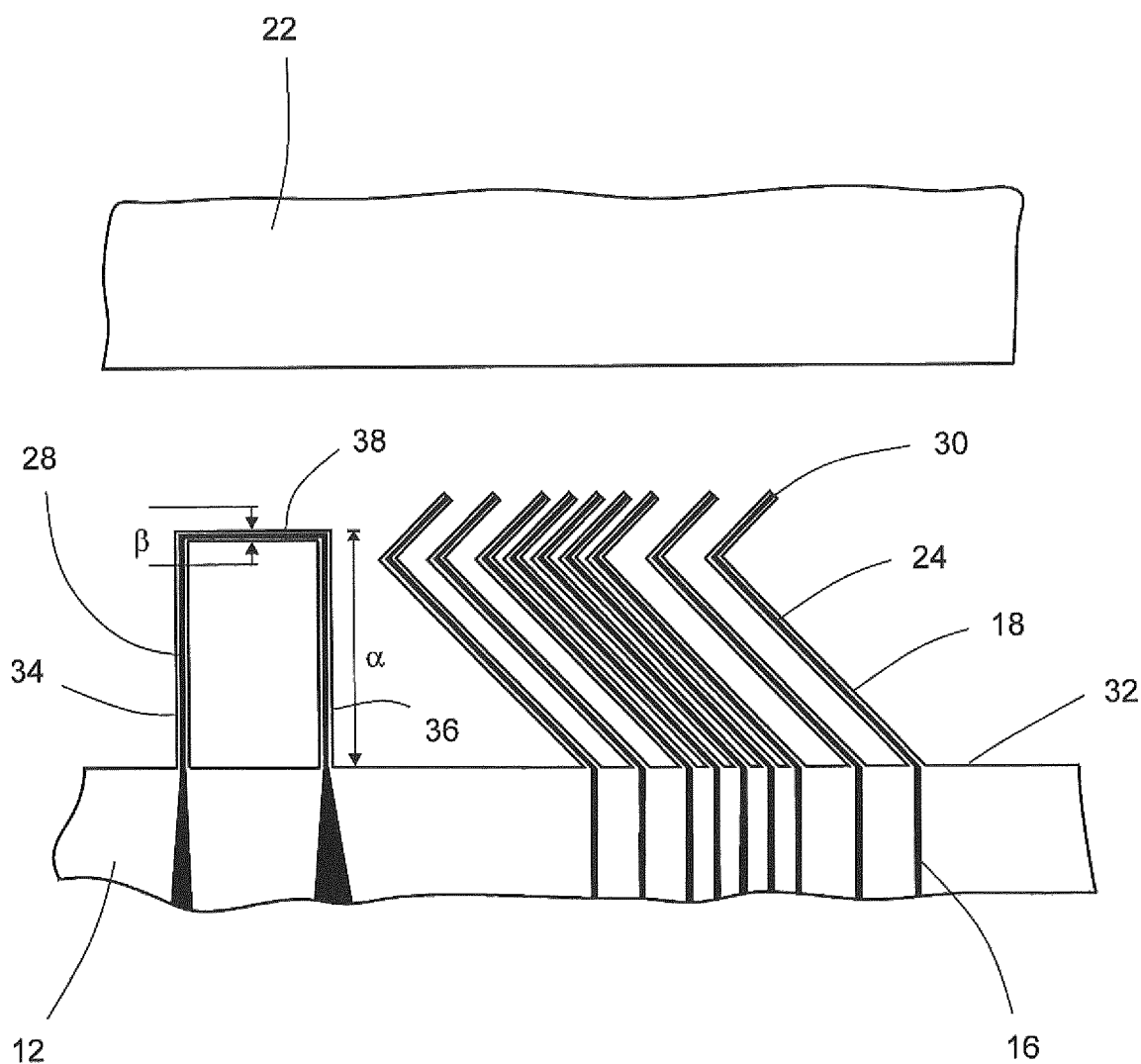
FIG. 2 shows an enlarged view of section I in FIG. 1.

FIG. 2 shows an enlarged view of section I in FIG. 1.

The probe 10 comprises a cantilever 18. Seven other cantilevers can be seen in FIG. 2, and the probe may in general have a set of cantilevers ranging from 1 to 16 cantilevers.

Each cantilever supports a contact probe 24 for contacting a point or small area on the surface of the test sample, and establishes an electrical connection to the test sample.

It may be necessary to burn through an oxide layer on the test sample before measuring an electrical property of the test sample. This may be done with a current in the contact probe applied with a breakdown voltage (across two contact probes), which is high enough to cause a breakdown of the dielectric oxide—such voltage may be greater than 5 V.

A contact probe or electrode is constituted by an electrically conducting metal film deposited on a cantilever surface facing the surface of the test sample when a test is performed. Normally, the metal film covers the width of the cantilever, since it is being deposited from above, and if no pattern is used to deposit the film, the film will cover what it lands on.

The cantilevers are made of a dielectric material in order to electrically insulate the contact probe from the probe body such that a current does not run from one contact probe to another if the probe has a plurality of contact probes.

The probe shown in FIGS. 1 and 2 is a micro eight point probe, but in general the probe may have any number of contact probes, i.e. the probe may have four contact probes thereby constituting a micro four point probe or it may have twelve contact probes thereby constituting a micro twelve point probe.

Each cantilever may support more than one contact probe.

Each cantilever has an L-shape such that it is more flexible in three dimensions than a straight cantilever for example.

Each cantilever has a distal end 30 (tip end comprising a tip) being furthest from the probe body 12, i.e. with a certain distance between the distal end and the probe body. The distance between the distal end and the probe body is typically in the range of 5 to 200 μm.

A proximal end of a cantilever is defined as being opposite the distal end, i.e. furthest from the distal end. Thus, the proximal end being closer to the probe body than the distal end.

Each cantilever is supported by the planar body surface at the proximal end and extends away from the probe body with a vector component in a direction normal to the front surface 32 of the probe body 12, and in a cantilever plane parallel to the planar surface of the probe body (co-planar with the planar body surface). When a cantilever contacts the test sample 22 it may flex out of the cantilever plane.

The axis extending through the proximal end and the distal end 30 constitutes a cantilever axis. In FIG. 2, the cantilever axis has an angle greater than zero with respect to the normal to the front surface 32 of the probe body (in part because of the L-shape of the cantilever). The cantilever may also be straight, in which case the cantilever is to extend with the cantilever axis being parallel with the normal to the front surface.

The probe comprises a first thermal detector, which can be seen to the left of the cantilevers, and extending parallel to the cantilevers.

The thermal detector extends in a detector plane parallel to the planar surface (co-planar with the planar body surface).

The thermal detector extends away from the same front surface 32 as the cantilevers. In FIG. 2, the thermal detector extends parallel to the normal of the front surface 32.

However, the thermal detector may have an angle between ±60° with respect to the normal of the front surface 32 in the detector plane.

The thermal detector defines a loop with respect to the probe body, i.e. it begins on the probe body, and ends on the probe body.

In FIG. 2, the thermal detector is formed by three straight segments constituted by a first arm 34, a second arm 36, and a front segment 38. The two arms are orthogonal to the front surface 32, and the front segment is parallel to the front surface.

A proximal end of the first arm is supported by the planar surface, and a proximal end of the second arm is supported by the planar surface. The front segment 38 extends between the distal end of the first arm and the distal end of the second arm.

More than three segments may be used to form the loop, and in a first alternative, the loop may be ring-formed defining a geometry such as a circle or an ellipse (not extending a full 360°). In a second alternative, the thermal detector may be formed by a plate, which may be as wide and long as the area covered by the three straight segments.

A distal end of the thermal detector (constituted by a detector end) has an anchor position with an anchor distance α to the probe body 12. The anchor distance (length of the thermal detector) is shown as being smaller than the distance between the distal end of a cantilever and the probe body.

It is contemplated that the thermal detector may extend as far away from the probe body as the cantilever 18, i.e. the length of the thermal detector is substantially the same as the length of the cantilever (substantially means that the length of the thermal detector does not deviate with more than 10% from the length of the cantilever).

It is also contemplated that the thermal detector may have a length, which is greater than the length of the cantilever, i.e.

The anchor distance α may be less than 200 μm such as less than 180 μm, 160 μm, 140 μm, 120 μm, or 100 μm down to less than 50 μm.

The front segment 38 is shown with a linewidth β, which may be in the range of 20 nm-20 μm, such as 100 nm-10 μm or 1 μm-5 μm. All the segments of the thermal detector may have such a width range.

The thermal detector supports an electrical conductor 28, which is constituted by an electrically conducting metal film deposited on the thermal detector surface. The metal film normally covers the width of the thermal detector, i.e. the width of the electrical conductor (such as on the front segment) may correspond to the linewidth β.

The metal film may be of the same material as the contact probe such as nickel, tantalum, aluminium, platinum, ruthenium, titanium, cobalt, iron, tungsten. The electrical conductor has an electrical resistance, which is temperature dependent.

Each contact probe (metal film) is connected to respective electrical lines on the probe body 12. The electrical lines connect the contact probes with contact pads, i.e. the contact probe 24 on the first cantilever 18 is electrically connected to a first electrical line 16, which leads to a first contact pad 14 (the contact probe and the electrical line may be deposited as a continuous metal film leading from the contact pad to the distal end of the cantilever).

Similarly, the electrical conductor 28 may be formed by depositing a metal film leading from a first contact pad on the probe body onto the thermal detector, and back to a second contact pad, i.e. the electrical conductor may form a loop with respect to a first contact pad on the probe body and a second contact pad on the probe body such that it may be used as an electrical resistance in an electrical circuit with two terminals connected to the first and second contact pad.

The contact pads are for establishing electrical connections between the probe and a test apparatus, i.e. the test apparatus has terminals which engage the contact pads on the probe when the probe is placed in the test apparatus. The test apparatus also has a power source such as a current source or a voltage source, and one or more electronic circuits for sending signals on the contact probes and the electrical conductor of the thermal detector. The electronic circuits may be implemented as one or more microprocessors.

An actuator of the test apparatus holds and moves the probe with respect to the test sample, which is also placed in the test apparatus.

During a measurement with the probe, an alternating current with a constant amplitude is injected into the electrical conductor 28 by means of a current source connected to the electrical conductor, i.e. the current may be a sine wave with a certain phase with a fundamental frequency ($1^{st}$ harmonic) selected in the range 1 Hz-10 kHz such as 1 kHz. Alternatively, the current may be a direct current.

Instead of a current source, a voltage source may be connected across the electrical conductor whereby a current will flow in the electrical conductor.

The current is to heat the electrical conductor 28 to a temperature above room temperature, which may be achieved with a current with an amplitude selected in the range 10 μA-10000 μA, such as 2000 μA, i.e. the power delivered to the electrical resistance of the electrical conductor is dissipated as heat.

In the present context, room temperature refers to a temperature between 15° C.-30° C., such as 20° C.-30° C., or 20° C.-25° C. or 25° C.-30° C.

Alternatively, the test sample may be heated to a temperature higher than that of the electrical conductor.

Near room temperature, the resistivity of metals typically increases as temperature is increased. If the temperature T does not vary too much, a linear approximation is typically used: $R(T)=R_0(1+c(T-T_0))$, where c is the temperature coefficient of resistance, $T_0$ is a fixed reference temperature (usually room temperature), and $R_0$ is the resistance at temperature $T_0$.

The probe is then moved towards the test sample, which is initially at room temperature.

The probe is moved towards the test sample with an angle with respect to the surface of the test sample, i.e. the probe may be moved with an angle of ±90° with respect to the normal of the test sample surface. Alternatively, the probe may be moved with an angle of 45°±40° (such as 45°±30° or 45°±15°) with respect to the surface of the test sample, i.e. it is not moved along the test sample parallel to the surface of the test sample.

As the probe approaches the test sample, the dissipation of the heat, generated by the electrical conductor, changes. When the thermal detector is far away from the sample surface, the heat is mainly dissipated into the probe body through thermal conduction along the thermal detector structure. The closer the thermal detector gets to the sample surface, the higher is the fraction of the generated heat that dissipates through the air into the sample itself. In this case, the sample can be considered a heat sink at constant temperature.

It is contemplated that the temperature of the electrical conductor decreases as the probe approaches the test sample (the current injected in the electrical conductor or the voltage across the electrical conductor may be held constant). The decrease in temperature of the electrical conductor means a decrease in the electrical resistance of the electrical conductor.

The electronic circuit of the test apparatus is used to measure the electrical resistance of the electrical conductor as the probe is moved towards the test sample. The electrical resistance may be measured using a Wheatstone bridge where the electrical resistance of the electrical conductor is one of the four electrical resistances used in the bridge.

Alternatively, a voltmeter may be used to measure the voltage drop across the electrical conductor (when the current is held constant, the measure of the voltage is a measure of the electrical resistance).

If a voltage source is used to have a constant voltage across the electrical conductor, a measured current in the electrical conductor is a measure of the electrical resistance of the electrical conductor 28.

The measure of the electrical resistance (the output provided by the measuring circuit of the electronic circuit) is used as a measure of how close the probe is to the test sample, i.e. the measure may be compared to a threshold value τ. When the measure of the electrical resistance reaches a threshold value, the probe is stopped.

Alternatively, the change of the measure of the electrical resistance or the change in voltage drop, which are equivalent measures, may be used as a measure of how close the probe is to the test sample.

The threshold value is selected so that when the threshold value is reached, the contact probe is in proximity to the test sample such that it only has to be moved a fixed distance the rest of the way towards the test sample.

Alternatively, the threshold value is selected so that when the threshold value is reached, the contact probe contacts the test sample An electric connection may be established between the contact probe and the test sample when the contact probe is in contact with the test sample.

The distance between the thermal detector and the sample surface should be reproducible from landing to landing and from probe to probe within 300 nm but preferably within 50 nm.

The threshold value may be determined via empirical measurements or by determining it as a function of the difference between the length of the thermal detector (anchor distance) and the length of the cantilever (the distance between the distal end and the proximal end of the cantilever).

Alternatively, the test sample may be heated while the current in the electrical conductor is held at a value, which does not heat the electrical conductor as much as the test sample is heated, i.e. the current may be at 100 μA for example, or lower.

As the probe is moved towards the test sample, the electrical conductor will be heated up by heat dissipated from the test sample, and the electrical resistance of the electrical conductor will go up. This may be measured with the electronic circuit and used as a measure of how close the thermal detector is to the test sample, i.e. the method is reverse to the method when the electrical conductor is heated.

It is also contemplated that the test sample may be cooled to a temperature below room temperature, which also provides for a temperature difference between the thermal detector and the test sample.

Figure 3:
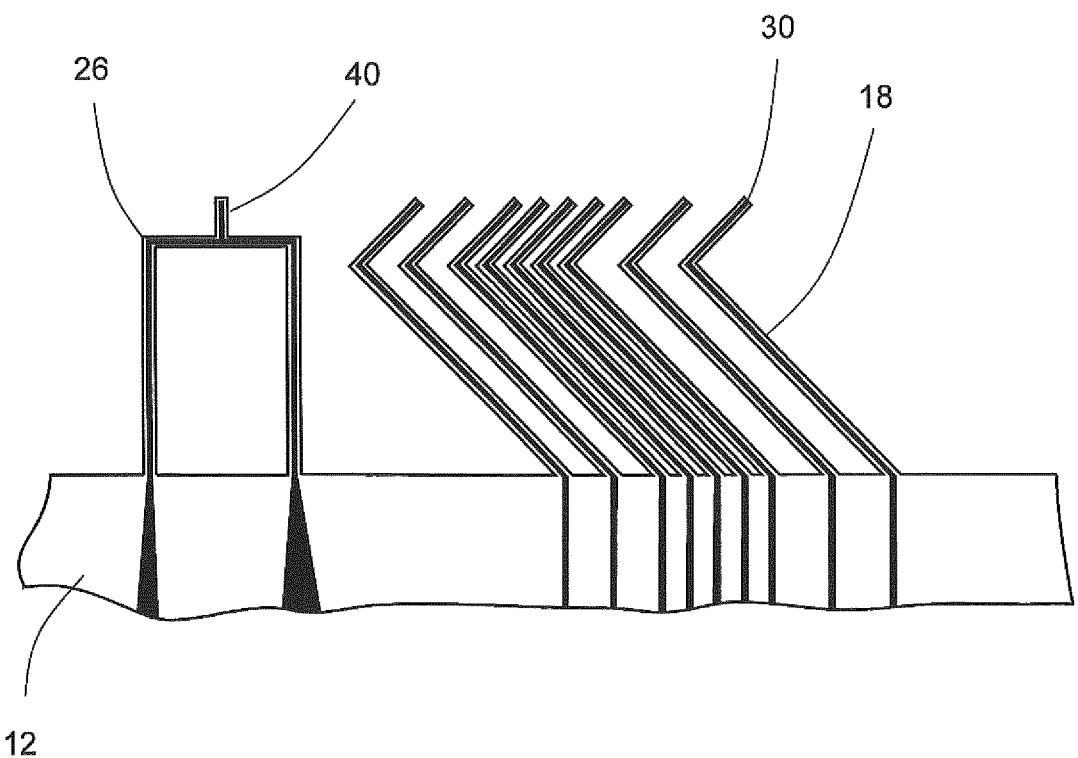
FIG. 3 shows an alternative embodiment where the thermal detector is provided with a projection.

FIG. 3 shows an alternative embodiment where the thermal detector is provided with a projection.

The projection 40 extends the length of the thermal detector so that the distal end of the thermal detector (which now corresponds to the distal end of the projection 40) extends as far from the probe body 12 as the cantilevers, i.e. the distal end of the thermal detector is aligned with the distal end of the cantilevers. In this way, the thermal detector will contact the test sample substantially simultaneously with the cantilevers—depending on whether or not the probe is tilted to a certain degree. The thermal detector may then alternatively be used as a strain gauge in order to determine the distance between the probe and the test sample.

Further alternatively, the projection allows the thermal detector to be used as a contact probe, i.e. the thermal detector may have a dual or triple purpose.

Figure 4:
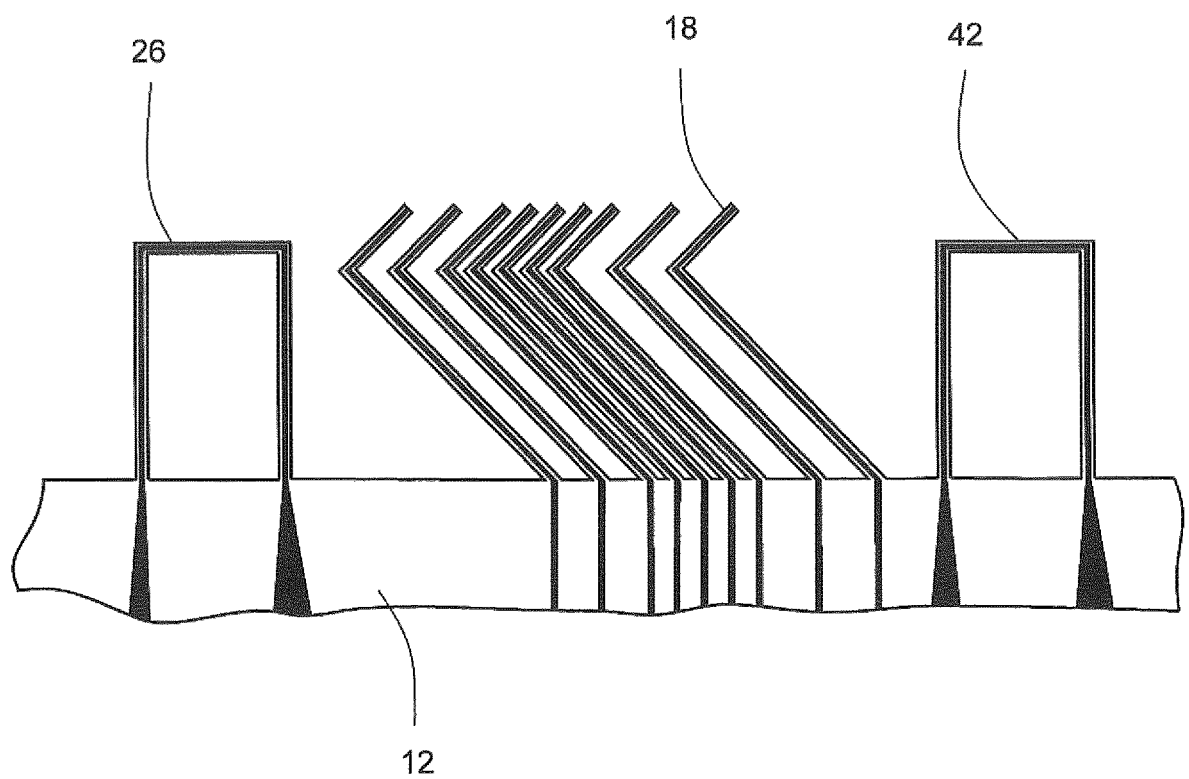
FIG. 4 shows an alternative embodiment of the probe.

FIG. 4 shows an alternative embodiment of the probe.

The probe comprises a second thermal detector 42 in addition to the first thermal detector 26 and the cantilevers such that a possible tilting of the probe may be identified, i.e. whether or not the tips (distal ends) of the cantilevers are parallel to a test sample surface. This reduces the risk of one of the outer cantilevers diving deeper into the test sample than desired.

The cantilevers are between the first thermal detector and the second thermal detector.

The second thermal detector supports a second electrical conductor the same way as the first thermal detector, as explained above, i.e. the second electrical conductor has an electrical resistance, which is temperature dependent, and it forms a loop with respect to a third contact pad on the probe body and a fourth contact pad on the probe body such that it may be used as an electrical resistance in an electrical circuit. The presence of the second thermal detector increases the number of contact pads on the probe body with two.

The two thermal conductors are ideally made as similar as possible, i.e. with the same anchor points/distances, and linewidths.

Figure 5:
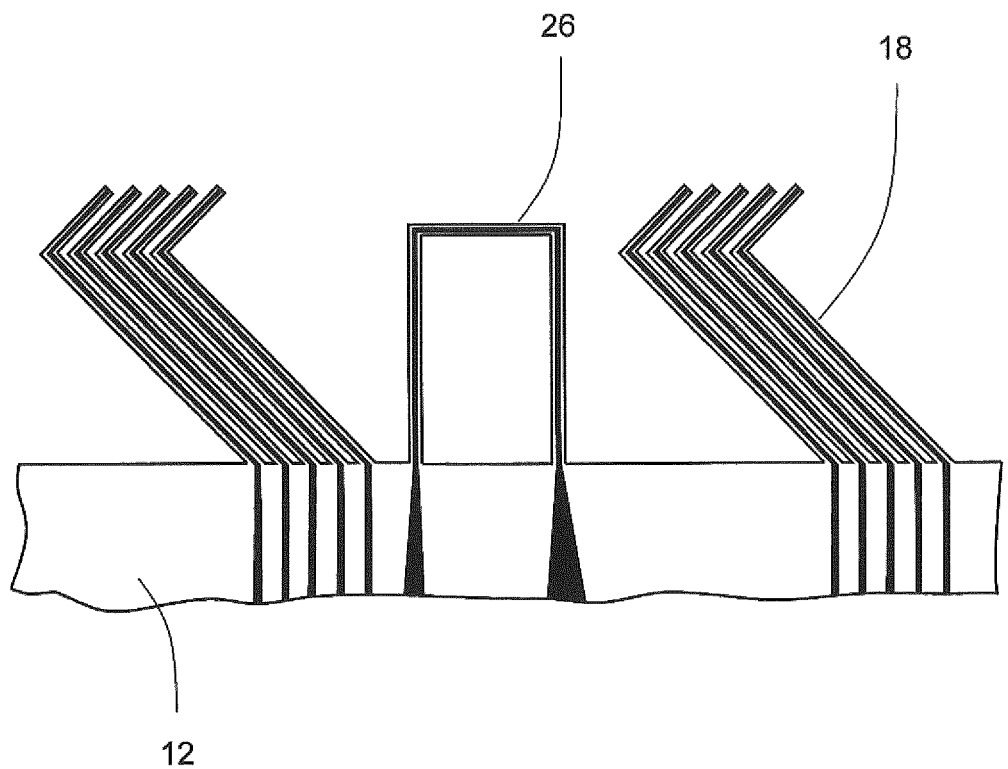
FIG. 5 shows an alternative embodiment, where the cantilevers have been divided up and placed on opposite sides of a single thermal detector.

FIG. 5 shows an alternative embodiment, where the cantilevers have been divided up and placed on opposite sides of a single thermal detector.

Figure 6:
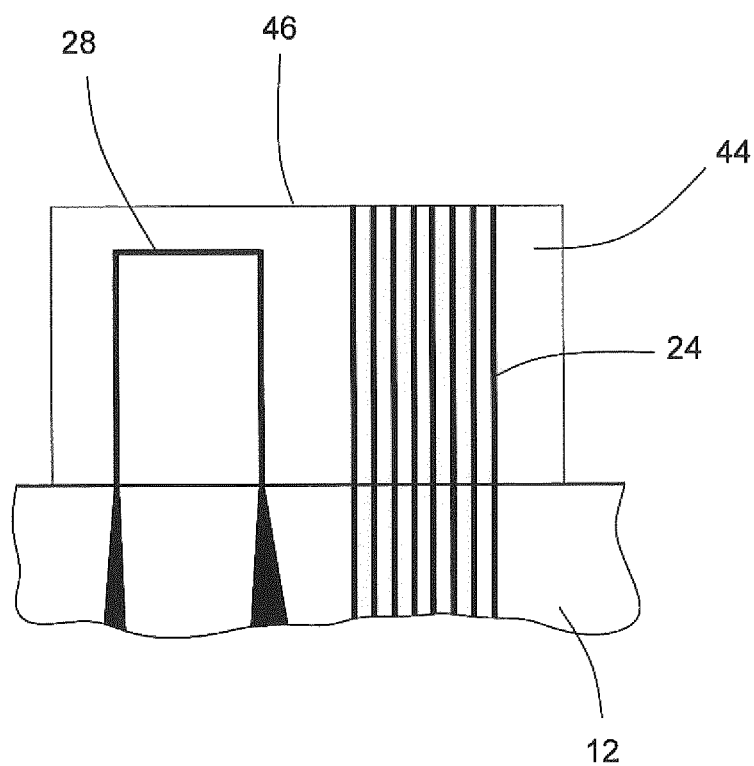
FIG. 6 shows an alternative embodiment where a single cantilever is used.

FIG. 6 shows an alternative embodiment where a single cantilever is used.

The single cantilever is constituted by an electrically insulating membrane 44 such as an oxide membrane. The single cantilever supports the first contact probe 24. Next to the first contact probe is shown seven other contact probes. The membrane 44 is shown supporting the electrical conductor 28 of the thermal detector, but it may be supported by a second membrane separate from the first membrane.

The first contact probe extends with the respective distal end to the membrane edge 46, which is furthest from the probe body. The other contact probes also extend to the membrane edge.

The distal end of the thermal detector 26 has a distance to the membrane edge 46, but it may extend all the way to the membrane edge.

The membrane allows for the contact probes to be deposited with a smaller linewidth, i.e. the cantilevers can be closer together without breaking due to the otherwise narrow cantilever width for each individual contact probe. The distance between the tips of the contact probes along the first edge may be less than 1 μm.

The electrical conductor 28 on the membrane 44 is shown as a loop with respect to the probe body 12.

Figure 7:
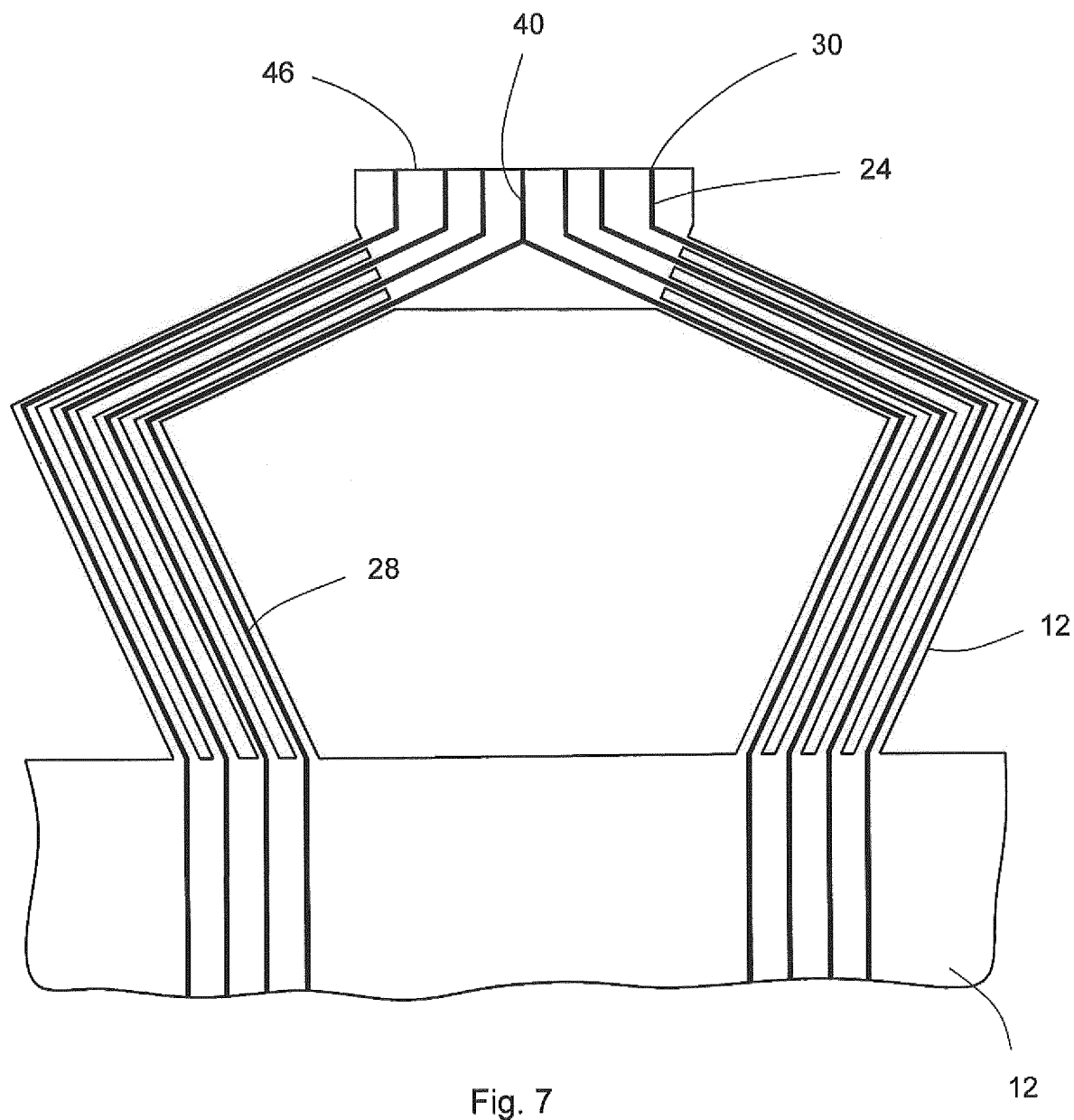
FIG. 7 shows an alternative embodiment of the probe.

FIG. 7 shows an alternative embodiment of the probe.

The membrane 44 is supported by a cantilever 18. A total of eight cantilevers may be used to support the membrane as illustrated in FIG. 7.

The cantilevers together with the membrane form a loop with respect to the probe body such that the structure is more flexible than the probe shown in FIG. 6, where the membrane is supported by the probe body.

The first cantilever 18 supports a contact probe, which extends onto the membrane all the way to the membrane edge 46.

The two middle cantilevers each supports metal films, which extend onto the membrane and are joined together on the membrane thereby forming an electrical conductor 28, which forms a loop with respect to the probe body. The electrical conductor 28 may have a temperature dependent electrical resistance, which may be used as a thermal detector the same way as described above with respect to FIGS. 1-6.

The metal films are adjoined on the membrane a distance from the membrane edge. From the adjoining point may extend a projection 40 to the membrane edge parallel with the contact probe 24, i.e. the electrical conductor 28 includes a projection 40. The projection 40 may serve the function of a strain gauge, which may also be used to determine the distance between the probe and the test sample. Additionally, the electrical conductor 28 may be used as a contact probe together with the other contact probes, i.e. the electrical conductor has a triple purpose as also described in connection with FIG. 3.

Due to the membrane 28, the contact probes may be placed close together. With the electrical conductor 28 also serving as a contact probe, the probe in FIG. 7 has a total of seven contact probes which extend parallel and closely together on the membrane (closer than when the contact probes are supported by individual cantilevers).

Figure 8:
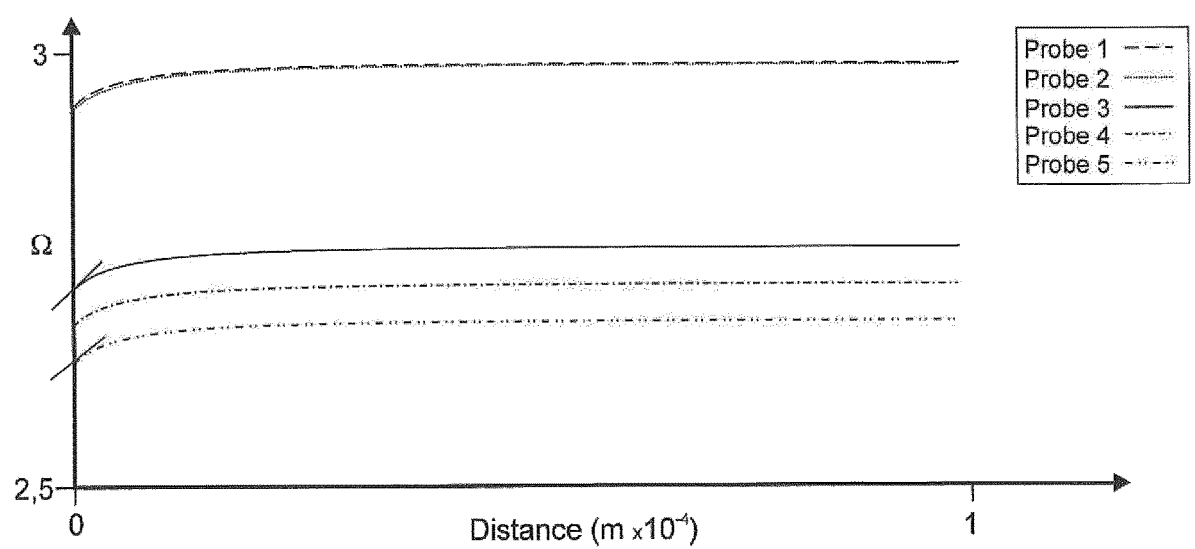
FIG. 8 shows a measurement with five probes.

FIG. 8 shows a measurement with five probes.

Each probe corresponds to one of the probes described in connection with any of FIGS. 2-7 such as the probe described in connection with FIG. 2. The measurement routine is performed also as described above in connection with FIG. 2.

The five probes differ with respect to manufacturing tolerances, i.e. the anchor position (the anchor distance α to the probe body from the distal end of the thermal detector), and the linewidth β of the electrical conductor at the distal end of the thermal detector, and the thickness of the electrical conductor 28 are different from probe to probe (a probe has dimensions in the micro meter range, which means that it is difficult to manufacture each probe with the exact same anchor distance and linewidth).

Probes 1, 2 and 3 have thermal detectors with electrical conductors 28, which are made of Ni with a thickness of 90 nm.

Probes 4 and 5 have thermal detectors with electrical conductors 28, which are made of Ni with a thickness of 110 nm.

In a measurement, the respective probe is moved towards the test sample while the electrical conductor of the thermal detector is heated with an electrical current. Each graph shows the measured electrical resistance as a function of the distance to the test sample. As the probe approaches the test sample, the electrical resistance decreases.

The five graphs are offset from each other due to varying geometric dimensions of the five probes. Furthermore, the sensitivity of each probe is different, which is illustrated with tangents with different inclinations (tangents are shown in FIG. 8 proximate a distance of 0 m for probes 3 and 5).

Figure 9:
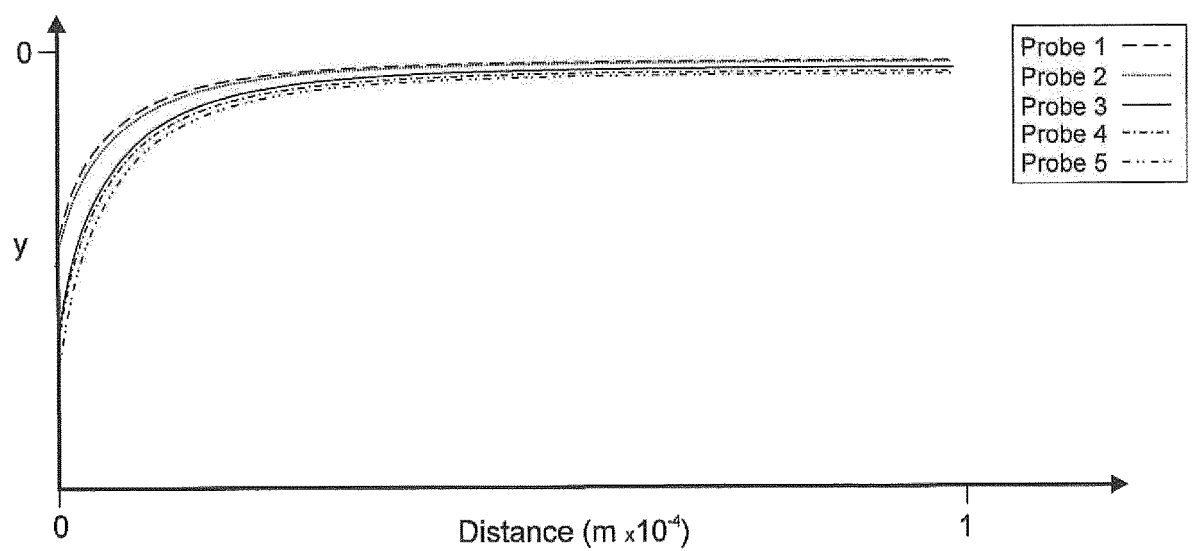
FIG. 9 shows the results of a normalization of each of the measurements shown in FIG. 8.

FIG. 9 shows the results of a normalization of each of the measurements shown in FIG. 8. In this description, the terms "normalization" and "resealing" are used interchangeably.

Compared to the graphs in FIG. 8, the graphs in FIG. 9 have smaller offsets and smaller differences in tangents.

In the normalization, the measured electrical resistance $R(T)$, denoted Ω in FIG. 8, is normalized with respect to geometric dimensions of the detector geometry, i.e. the anchor distance and the linewidth. The measured electrical resistance may be normalized with only one parameter.

The offset between the graphs in FIG. 8 is a function of the linewidth and metal (in this case Ni) film thickness, and the sensitivity is a function of the anchor distance, linewidth and metal film thickness.

The linewidth of a thermal detector of a respective probe may be measured as the physical dimension in meters. Alternatively, the linewidth may be expressed in terms of the electrical resistance measured at room temperature with a current sufficiently low to not alter the temperature of the thermal detector in a measurable way (the voltage drop over the electrical conductor at room temperature, which takes on a value $V_0$).

The anchor distance of a thermal detector of a respective probe may also be measured as the physical dimension in meters. Alternatively, the anchor distance may be expressed in terms of the difference between the electrical resistance measured at room temperature, and the electrical resistance measured at a temperature above room temperature (such as 5° C. or 10° C. above room temperature, depending on the current passing through the thermal detector).

For example, in a first measurement, a first current having a first amplitude (such as 100 uA) is injected into the electrical conductor, and the corresponding electrical resistance of the electrical conductor is measured.

In a second measurement, a second current having a second amplitude (such as 1000 uA) is injected into the electrical conductor, and the corresponding electrical resistance of the electrical conductor is measured (the voltage drop over the electrical conductor at the higher temperature, which takes on a value $V_T$). The second current raises the temperature of the electrical conductor to a temperature above room temperature.

The difference between the two measurements, which take on the value $\Delta V = V_0 - V_T$ is then used to express the anchor distance.

Using the measured values $V_0$ and $\Delta V$, the measure of the electrical resistance of the electrical conductor may be rescaled for example by dividing it with the square of each output:

$$y = f(R, V_0, V_T) = \frac{R(T)}{V_0^2 \Delta V^2}$$

The rescaled electrical resistance y is a function of the measured electrical resistance, and the electrical resistance measured at room temperature, and the electrical resistance at a temperature above room temperature.

Alternatively, the difference between the measured electrical resistance, $R(T)$, and $R'$ may be used to calculate a resealed electrical resistance, where $R'$ is the electrical resistance measured at a distance far enough away from the sample that the electrical resistance of the electrical conductor is unaffected by the proximity of the test sample. In FIG. 8, R' could be the electrical resistance measured at e.g. 100 µm, which is the measurement made furthest away from the sample.

In this case:

$$y = f(R, V_0, V_T) = \frac{R(T) - R'}{V_0^2 \Delta V^2}$$

The above resealed electrical resistance y is shown in FIG. 9 and is a function of the difference between the measured electrical resistance, R(T), and R', and the electrical resistance measured at room temperature, and the electrical resistance at a temperature above room temperature.

Compared to the graphs in FIG. 8, the resealing brings the measurements closer together, i.e. the offset between the graphs in FIG. 9 has become smaller, and the difference in sensitivity between the five probes is also smaller.

Figure 10:
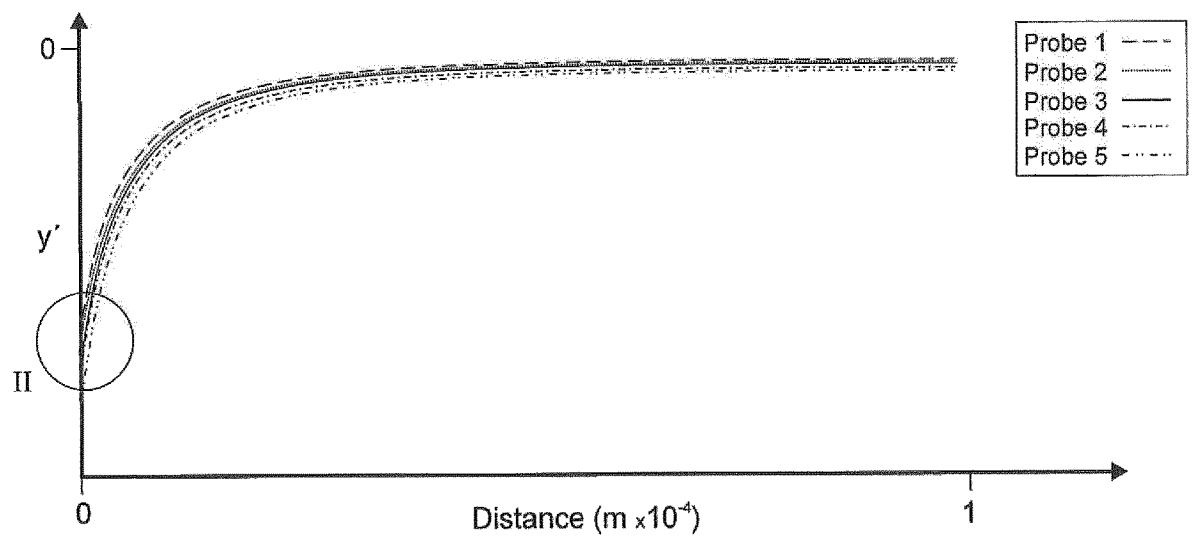
FIG. 10 shows the results of a further rescaling of the measured electrical resistance of the electrical conductor.

FIG. 10 shows the results of a further resealing of the measured electrical resistance of the electrical conductor.

Compared to the resealed graphs in FIG. 9, the graphs in FIG. 10 have even smaller offsets and smaller differences in tangents.

In the further resealing, the measured electrical resistance is resealed (multiplied) by the thickness ω of the electrical conductor, i.e. the thickness of the metal film layer deposited on the thermal detector. The thickness may be known from the depositing process or it may be determined in an electrical measurement.

Using the thickness ω, the normalized electrical resistance $y_1$ of the electrical conductor may be further resealed for example by multiplying it with the square of the thickness:

$$y_1' = f(R, V_0, V_T, \omega) = \frac{R(T)}{V_0^2 \Delta V^2} \omega^2$$

Thus, the further resealed electrical resistance $y_1'$ is a function of the measured electrical resistance, and the electrical resistance measured at room temperature, and the electrical resistance at a temperature above room temperature, and the thickness of the electrical conductor.

In another example of a further resealing, the resealed electrical resistance y is resealed (multiplied) by the square of the thickness m of the electrical conductor, i.e. the thickness of the metal film layer deposited on the thermal detector:

$$y' = f(R, V_0, V_T) = \frac{R(T) - R'}{V_0^2 \Delta V^2} \omega^2$$

Thus, the further resealed electrical resistance y' shown in FIG. 10 is a function of the difference between the measured electrical resistance and R', and the electrical resistance measured at room temperature, and the electrical resistance at a temperature above room temperature, and the thickness of the electrical conductor.

Compared to the graphs in FIG. 9, the normalization brings the measurements even closer together, i.e. the offset between the graphs in FIG. 10 has become smaller, and the difference in sensitivity between the five probes is also smaller.

Figure 11:
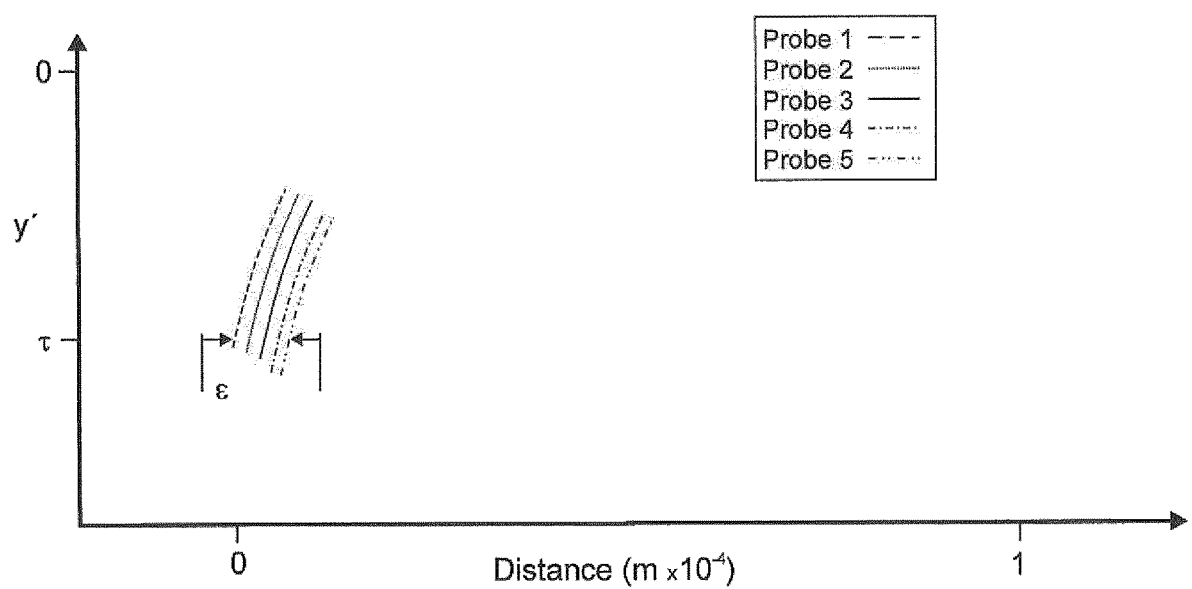
FIG. 11 shows a magnification of the graphs in the circled area II of FIG. 10.

FIG. 11 shows a magnification of the graphs in the circled area II of FIG. 10.

Each probe is stopped when it reaches a threshold value (selected in the range between −1.000 to −2.000, and in the present case having τ=−1.600).

The magnification shows that the normalization does not necessarily make the measurements with the five probes identical, and that the probes are stopped at different positions/distances to the test sample. At whichever threshold, the probes are stopped, there is a corresponding difference (error ε) between the probe, which is stopped with the contact probe closest to the test sample (probe 1), and the probe, which is stopped with the contact probe furthest to the test sample (probe 5). At a threshold value τ=−1.600, the difference is 200 nm.

A number of measurements with a number of probes may be performed in order to determine, which threshold brings the error ε below a certain (second) threshold. Since it is not desirable to have the probe go too deep into the test sample, a certain error may be accepted (such as 200 nm).

Thus, the threshold τ Which is decisive for when the probe is stopped may be determined as a function of the error ε—for example from an empirical experiment with five probes as described above, i.e. when the error ε is below a value (such as 200 nm or 100 nm or 50 nm), the electrical resistance of the electrical conductor, which is measured when the error goes below that value, may be used as the threshold for when the probe is to be stopped in an actual measurement of a test sample to be measured. In the empirical experiment shown in FIG. 11, the determined threshold is τ=−1.600 as described above.

When a resealing has been done, it may be used with all thermal detectors having the same design, i.e. same geometry, same dimensions, such as anchor distance and linewidth within manufacturing tolerances, and same materials. When the thermal detector has a projection, the geometry of the projection must also be the same (within manufacturing tolerances).

If a thermal detector has been calibrated, i.e. a distance vs. thermal signal has been measured, all the other thermal detectors of the same design are calibrated thanks to the resealing. The thermal signal is the measured resistance of the electrical conductor, R(T), where an example is shown in FIG. 8.

Thus, of significance, the calibration allows knowing the distance to the surface of a test sample at any given thermal signal measured for all the thermal detectors with that design.

As an alternative measurement procedure for the temperature dependent component of the electrical resistance of the electrical conductor, a high harmonic filtering is proposed.

In such a method, the electrical resistance of the electrical conductor 28 is measured using an alternating current injected in the electrical conductor, i.e. the current may be a sine wave with a certain phase with a fundamental frequency (1$^{st}$ harmonic) selected in the range 1 Hz-10 kHz such as 1 kHz.

The current may be used to heat the electrical conductor or other means may be used to establish a temperature difference between the electrical conductor and the test sample as described above.

The electrical resistance of the electrical conductor is then measured using an electronic circuit such as a Wheatstone bridge or a voltmeter.

The measured electrical resistance is then filtered by means of a high pass filter with a cut off frequency lower than a second harmonic of the first frequency, i.e. for suppressing the first harmonic with respect to the higher harmonics. Alternatively, the measured electrical resistance can be filtered with a bandpass filter center around a specific higher order harmonic (such as the $2^{nd}$ harmonic) so that the selected harmonic component may be amplified with respect to the first harmonic.

The filtered signal may then be used as a measure for the proximity between the thermal detector and the test sample. Thus, when moving the probe towards the test sample the probe is stopped when the filtered signal reaches a threshold value. Such a threshold value may be determined empirically as described above.

In the following is given a list of reference signs that are used in the detailed description of the invention and the drawings referred to in the detailed description of the invention.

LIST OF REFERENCES

α Anchor distance
β Linewidth of a thermal detector
ω Thickness of the electrical conductor, i.e. the metal film thickness
10 Probe
12 Probe body
14 Contact pad
16 Electrical line
18 Cantilever
22 Test sample
24 Contact probe
26 Thermal detector
28 Electrical conductor
30 Distal end
32 Front surface
34 First arm
36 Second arm
38 Front segment
40 Projection
42 Second thermal detector
44 Membrane
46 Membrane edge
48 Detector end

The invention claimed is:

1. A method of approaching a probe to a test sample for testing an electrical property of said test sample, said method comprising:
providing a probe having a probe body defining a planar surface for supporting a first cantilever, and a first thermal detector,
said first cantilever extending from said probe body in a co-planar relationship with respect to said planar surface between a first proximal end supported by said planar surface and a first distal end opposite to said first proximal end,
said first cantilever having a cantilever surface supporting a first contact probe,
said first thermal detector extending from said probe body in a co-planar relationship with respect to said planar surface between a second proximal end supported by said planar surface, and a second distal end opposite said second proximal end,
said first thermal detector having a detector surface supporting an electrical conductor with a temperature dependent electrical resistance,
said method further comprising:
establishing a temperature difference between said electrical conductor and said test sample, injecting an electric current in said electrical conductor,
providing an electronic circuit, connecting said electronic circuit to said electrical conductor, measuring said temperature dependent electrical resistance by means of said electronic circuit while moving said probe towards said test sample, and
stopping said probe when said temperature dependent electrical resistance reaches a first threshold value representing the occurrence of said contact probe being in proximity or contacting said test sample.

2. The method according to claim 1, said probe having a second cantilever extending from said probe body in a co-planar relationship with respect to said planar surface.

3. The method according to claim 1, comprising measuring said temperature dependent electrical resistance by measuring a voltage drop across said temperature dependent electrical resistance.

4. The method according to claim 1, said probe having a second thermal detector extending from said probe body in a co-planar relationship with respect to said planar surface.

5. The method according to claim 1, said first thermal detector defining a loop with respect to said probe body.

6. The method according to claim 1, comprising providing a heater or a cooler for establishing said temperature difference between said electrical conductor and said test sample.

7. The method according to claim 1, said electric current having an amplitude such that said electrical conductor is heated to a temperature above room temperature.

8. A system for testing an electrical property of a test sample, said system comprising:
a probe having a probe body defining a planar surface for supporting a first cantilever, and a first thermal detector,
said first cantilever extending from said probe body in a co-planar relationship with respect to said planar surface between a first proximal end supported by said planar surface and a first distal end opposite to said first proximal end,
said first cantilever having a cantilever surface supporting a first contact probe,
said first thermal detector extending from said probe body in a co-planar relationship with respect to said planar surface between a second proximal end supported by said planar surface, and a second distal end opposite said second proximal end,
said first thermal detector having a detector surface supporting an electrical conductor with a temperature dependent electrical resistance, said system further comprising:
a heater or a cooler for establishing a temperature difference between said electrical conductor and said test sample,
a power source interconnected with said electrical conductor for injecting a current in said temperature dependent electrical conductor,
an actuator for moving said probe towards said test sample, and
an electronic circuit interconnected with said electrical conductor for measuring said temperature dependent electrical resistance, and for comparing said temperature dependent electrical resistance with a threshold value.

9. A method of normalizing a measurement of a thermal detector measuring a proximity between said thermal detector and a test sample, said method comprising:
- providing a probe having a probe body defining a planar surface for supporting a thermal detector,
- said thermal detector extending from said probe body in a co-planar relationship with respect to said planar surface between a proximal end supported by said planar surface, and a distal end opposite said proximal end,
- said thermal detector defining a detector geometry with a first geometric dimension, and having a detector surface supporting an electrical conductor with a temperature dependent electrical resistance,
- said method further comprising:
- injecting a current in said electrical conductor,
- providing an electronic circuit, connecting said electronic circuit to said electrical conductor and measuring said electrical resistance by means of said electrical circuit for providing an output, and
- performing a mathematical normalization of said output by said first geometric dimension such that said output being normalized with respect to said detector geometry.

10. The method according to claim 9, comprising representing said first geometric dimension by a measure of said temperature dependent electrical resistance at room temperature.

11. The method according to claim 9, said detector geometry having a second geometric dimension, and said method further comprising performing said mathematical normalization by said second geometric dimension.

12. The method according to claim 11, comprising representing said second geometric dimension by a measure of the difference between said temperature dependent electrical resistance at room temperature and said temperature dependent electrical resistance at a temperature above room temperature.

13. A method of determining a proximity between a thermal detector and a test sample, said method comprising:
- providing a probe having a probe body defining a planar surface for supporting a thermal detector,
- said thermal detector extending from said probe body in a co-planar relationship with respect to said planar surface between a proximal end supported by said planar surface, and a distal end opposite said proximal end,
- said thermal detector defining a detector geometry with a first geometric dimension, and having a detector surface supporting an electrical conductor with a temperature dependent electrical resistance,
- said method further comprising:
- establishing a temperature difference between said electrical conductor and said test sample, injecting an alternating current with a first frequency in said electrical conductor,
- providing an electronic circuit, connecting said electrical circuit to said electrical conductor, measuring said electrical resistance by means of said electronic circuit and providing an output while moving said probe towards said test sample,
- providing a filter with a cut off frequency lower than a second harmonic of said first frequency, filtering said output by means of said high pass filter, and providing a filtered signal, and
- using said filtered signal as a measure for the proximity between said thermal detector and said test sample.

14. The method according to claim 13, said filter being provided in a frequency domain by transforming said output from a time domain to the frequency domain, and reducing a magnitude of said output below said cut off frequency with respect to a magnitude of said output above said cut off frequency.

15. The method according to claim 13, said filter being a high pass filter or a band pass filter around a specific harmonic.

* * * * *